US009246418B2

(12) United States Patent
Becker et al.

(10) Patent No.: US 9,246,418 B2
(45) Date of Patent: Jan. 26, 2016

(54) EC MOTOR WITH DYNAMIC DETERMINATION OF OPTOCOUPLER DEGRADATION

(71) Applicant: ebm-papst Mulfingen GmbH & Co. KG, Mulfingen (DE)

(72) Inventors: Eduard Becker, Ingelfingen (DE); Martin Schmitt, Lauda-Konigshofen (DE); Alexander Hertrich, Dorzbach (DE); Michael Eggensperger, Zweiflingen-Friedrichsruhe (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 80 days.

(21) Appl. No.: 14/277,195

(22) Filed: May 14, 2014

(65) Prior Publication Data

US 2014/0346987 A1    Nov. 27, 2014

(30) Foreign Application Priority Data

May 27, 2013    (DE) .......................... 10 2013 105 419

(51) Int. Cl.
| | |
|---|---|
| *H02P 6/00* | (2006.01) |
| *H02P 7/08* | (2006.01) |
| *H04B 10/80* | (2013.01) |
| *H04Q 9/00* | (2006.01) |
| *H02P 6/08* | (2006.01) |
| *H02P 29/02* | (2006.01) |
| *G01R 31/26* | (2014.01) |

(52) U.S. Cl.
CPC ................ *H02P 6/001* (2013.01); *H02P 6/085* (2013.01); *H02P 29/021* (2013.01); *H04B 10/802* (2013.01); *H04Q 9/00* (2013.01); *G01R 31/2635* (2013.01); *H04Q 2209/823* (2013.01)

(58) Field of Classification Search
CPC ... G01R 31/2635; H02P 29/021; H02P 6/001; H02P 6/085; H04B 10/802; H04Q 2209/823; H02K 17/18
USPC ............ 318/400.21, 570, 640, 400.4; 327/88, 327/93; 714/48, 52; 340/3.43, 3.44
See application file for complete search history.

(56) References Cited

U.S. PATENT DOCUMENTS

| | | | | |
|---|---|---|---|---|
| 4,740,687 | A * | 4/1988 | Kiyohara | ........... H03K 17/7955 250/214 R |
| 4,774,656 | A * | 9/1988 | Quatse | ................. G05B 19/054 714/4.1 |
| 4,864,531 | A * | 9/1989 | Quatse | ................. G05B 19/054 340/3.43 |
| 5,276,359 | A * | 1/1994 | Chiang | ................. G06F 3/0383 323/315 |
| 6,252,436 | B1 * | 6/2001 | Miettinen | ............... H03K 17/18 327/88 |
| 7,106,172 | B2 * | 9/2006 | Neveux | ................... E05B 81/78 340/426.36 |
| 7,148,738 | B2 * | 12/2006 | Knoop | ................. G05B 19/054 327/172 |

* cited by examiner

*Primary Examiner* — Rita Leykin
(74) *Attorney, Agent, or Firm* — Harness, Dickey & Pierce, P.L.C.

(57) ABSTRACT

In an EC motor, comprising a motor electronics, a signal input or a signal output, and an optocoupler for the galvanically isolated transmission of a useful signal between the motor control unit and the signal input or the signal output, the intention is to reliably determine the degradation of the optocoupler and to improve the service life of the EC motor. This is achieved in that an evaluation unit regularly evaluates a saturation voltage of the optocoupler at the output of the optocoupler in relation to a reference threshold when the optocoupler is wired and generates a warning signal when the saturation voltage exceeds the reference threshold.

7 Claims, 4 Drawing Sheets

EC MOTOR WITH DYNAMIC DETERMINATION OF OPTOCOUPLER DEGRADATION

CROSS-REFERENCE TO RELATED APPLICATIONS

This application claims the benefit and priority of German patent application No. 10 2013 105 419.6, filed May 27, 2013. The entire disclosure of the above application is incorporated herein by reference.

FIELD

The present invention relates to an EC motor comprising a motor electronics, a signal input or a signal output, and an optocoupler for the galvanically isolated transmission of a useful signal between the motor control unit and the signal input or the signal output.

BACKGROUND

This section provides background information related to the present disclosure which is not necessarily prior art.

In EC motors, optocouplers are used for the galvanically isolated signal transmission of useful signals for open-loop, closed-loop or monitoring functions. The galvanic isolation is used to protect individuals and material and in particular isolates the sensitive open-loop control electronics, to which an EC motor is connected, from the motor electronics of the EC motor. Inexpensive optocouplers, in which simple and inexpensive IC structures are utilised, are used in particular in EC motors for products with a high number of parts. These inexpensive variants of optocouplers consist of an optical emitter, typically a light-emitting diode (LED), and an optical receiver, in particular a phototransistor. However, these components degrade over time, depending in particular on the input current used and the ambient temperature. Degraded optocouplers cause erroneous signal transmission and thus malfunctions in the motor electronics, and this in turn can have a negative influence on other parts of the EC motor and reduce the service life thereof.

The direct current transfer ratio (CTR) of an optocoupler indicates the ratio, in percent, between the input current $I_F$ and the output current $I_C$. It is known that the CTR decreases with a degraded optocoupler. In this regard, optocoupler manufacturers have general service life graphs which show an aging ratio as a function of the temperature and the input current. In order to determine the actual CTR of an optocoupler in an EC motor, the input current $I_F$ and the output current $I_C$ have to be measured. Owing to the measured variables being galvanically isolated and to the different ground potentials, the evaluation is only possible using complex and time- and cost-intensive measuring circuits.

In addition, the definition of end of the service life varies according to the manufacturer, with some feeling that the end of the service life is when the CTR is reduced to 50% of the start value of a new optocoupler. Normally, a very large tolerance range is given for the CTR (for example, Vishay TCLT1105 has a CTR of from 50% to 150%). The actual end of the service life of an optocoupler in an EC motor cannot be reliably established by assessing the service life graphs of the manufacturer and measuring or calculating the CTR. The actual end of the service life depends very much on how the optocoupler is wired, i.e. with respect to the motor electronics, and on the true input current and the true ambient temperatures. In the case of the end of the service life being theoretically defined as 50% of the original CTR start value of a new optocoupler, the functionality of a motor electronics wired to the output of the optocoupler can still be guaranteed in practice.

SUMMARY

This section provides a general summary of the disclosure, and is not a comprehensive disclosure of its full scope or all of its features.

It is an object of the invention to provide an EC motor in which the degradation of an optocoupler is reliably determined and the service life of the EC motor is improved.

In an EC motor of the type described at the outset, this object is achieved according to the invention in that, when the optocoupler is wired, an evaluation unit regularly evaluates a saturation voltage of the optocoupler at the output of said optocoupler in relation to a reference threshold and generates a warning signal when the saturation voltage exceeds the reference threshold.

An EC motor of this type allows for the actual, acute degradation of an optocoupler in the EC motor to be determined and thus for the predicted service life of the EC motor to be more reliably determined, and warns the user of the EC motor in good time of malfunctions in the EC motor as a result of a degraded optocoupler. In this way, the service life of the optocoupler for the EC motor used can be utilised to a maximum in the particular application and the degraded optocoupler can be replaced in good time before a probable failure. This optimises costs and extends the service life of the EC motor.

In a specific embodiment of the invention, the evaluation unit comprises two resistors and a comparator, the resistors being designed as voltage distributors such that they generate a reference voltage, corresponding to the reference threshold, at the first input of the comparator, and the output of the optocoupler is connected to a second input of the comparator, so that the saturation voltage is applied at the second output of the comparator when the optocoupler is wired, and the comparator generates a warning signal at an output of the evaluation unit when the saturation voltage exceeds the reference threshold. This allows the evaluation unit to be designed particularly simply with minimal costs.

In an alternative embodiment of the invention, the evaluation unit comprises an amplifier and a microprocessor, the input of the amplifier being connected to the output of the optocoupler, so that the saturation voltage is applied at the input of the amplifier when the optocoupler is wired, and the output of the amplifier is connected to an input of the microprocessor, the microprocessor evaluating the amplified saturation voltage and comparing this with the reference threshold, and the microprocessor generating a warning signal at an output of the evaluation unit when the amplified saturation voltage exceeds the reference threshold. This allows the evaluation logic and the reference threshold to be adapted flexibly in the evaluation unit so that the evaluation unit can be adapted for example to different types of optocoupler using simple programming in the evaluation unit.

In another embodiment of the invention, the evaluation unit generates an adjustment signal for the closed-loop control of an input current of the optocoupler on the basis of the ratio of the saturation voltage value to the reference threshold, the adjustment signal being directly or indirectly connected to an input of a current regulator for controlling the input current in a closed-loop manner. This makes it possible to optimise the input current, which is used, for the optocoupler in terms of the current use and current degradation state of the optocoupler in order to extend the service life of the optocoupler and at the same time to minimise the power used.

It is particularly advantageous if the EC motor according to the invention comprises at least one second optocoupler, for transmitting a second useful signal, and a modulator and a demodulator, the modulator modulating, upstream of the input of the second optocoupler, the adjustment signal for the current regulator of the first optocoupler onto the useful signal to be transmitted via the second optocoupler, and the demodulator demodulating, downstream of the output of the second optocoupler, the adjustment signal for the current regulator of the first optocoupler from the useful signal. This allows for galvanic isolation when the adjustment signal is transmitted and optimises costs, since an existing optocoupler for transmitting a useful signal is used to transmit the adjustment signal. There is thus no need for an additional optocoupler solely to transmit the adjustment signal in a galvanically isolated manner.

The aforementioned components to be used according to the invention, as claimed and as described in the embodiments, are not subject to any particular exceptional conditions in terms of their size, shape, design, choice of material and technical conceptions, so the selection criteria known in this field of application can be applied without any limitations.

DRAWINGS

The drawings described herein are for illustrative purposes only of selected embodiments and not all possible implementations, and are not intended to limit the scope of the present disclosure.

Additional particularities, features and advantageous developments of the invention emerge from the embodiments described below and depicted in the drawings, and from the dependent claims. In the drawings:

Figure 3:
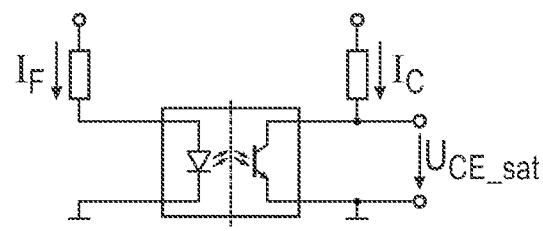
Figure 4A:
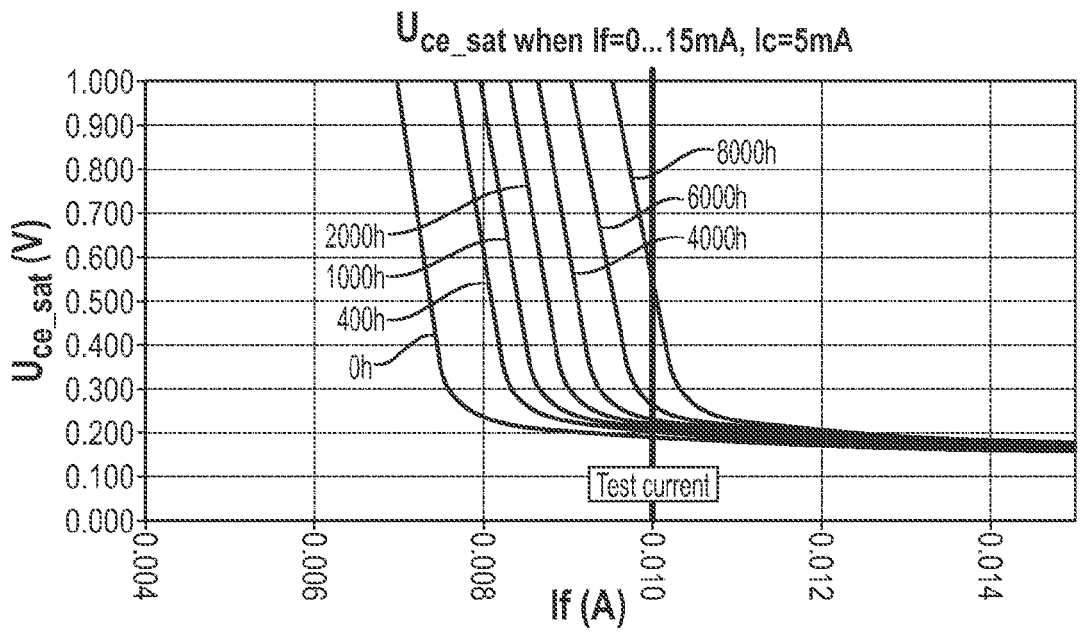
Figure 4B:
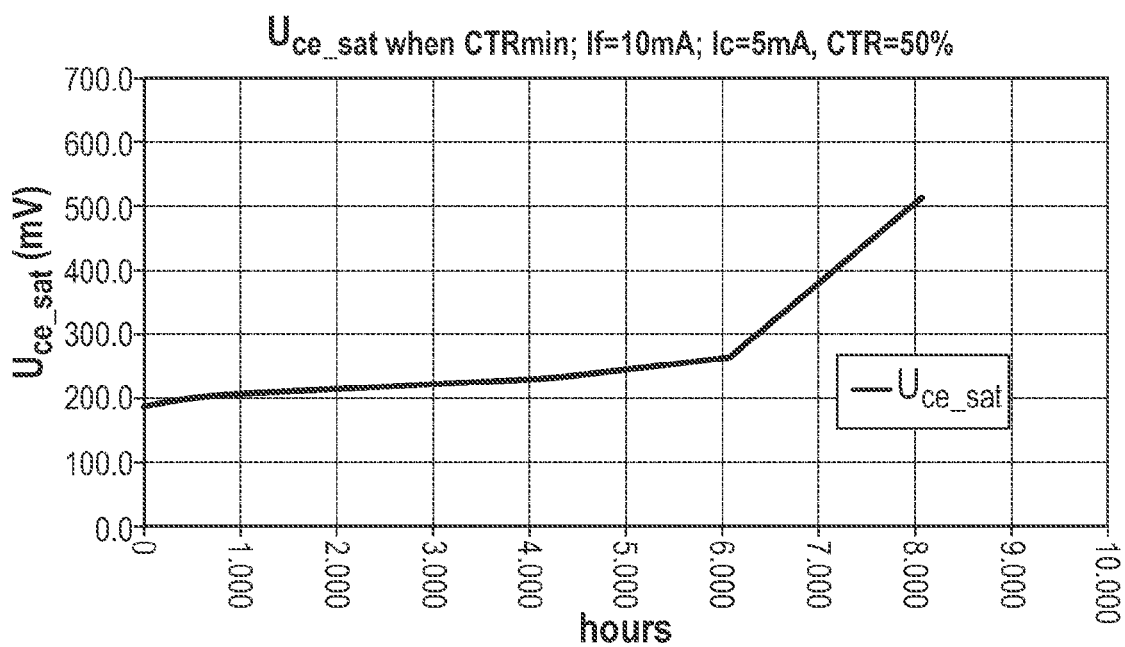
Figure 5:
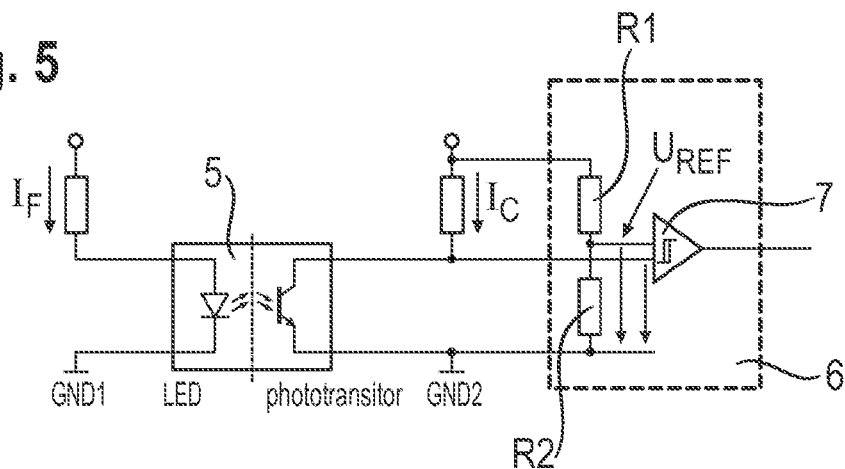
Figure 6:
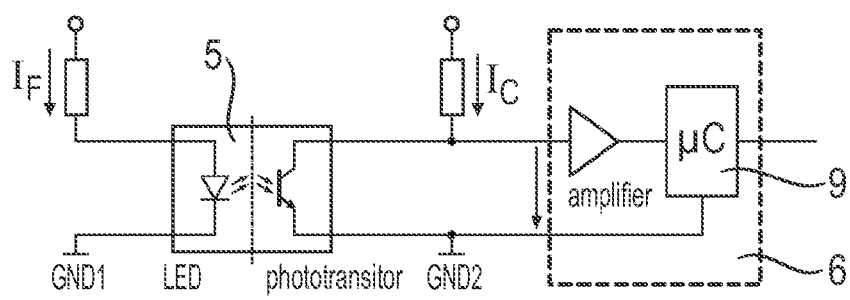
Figure 7:
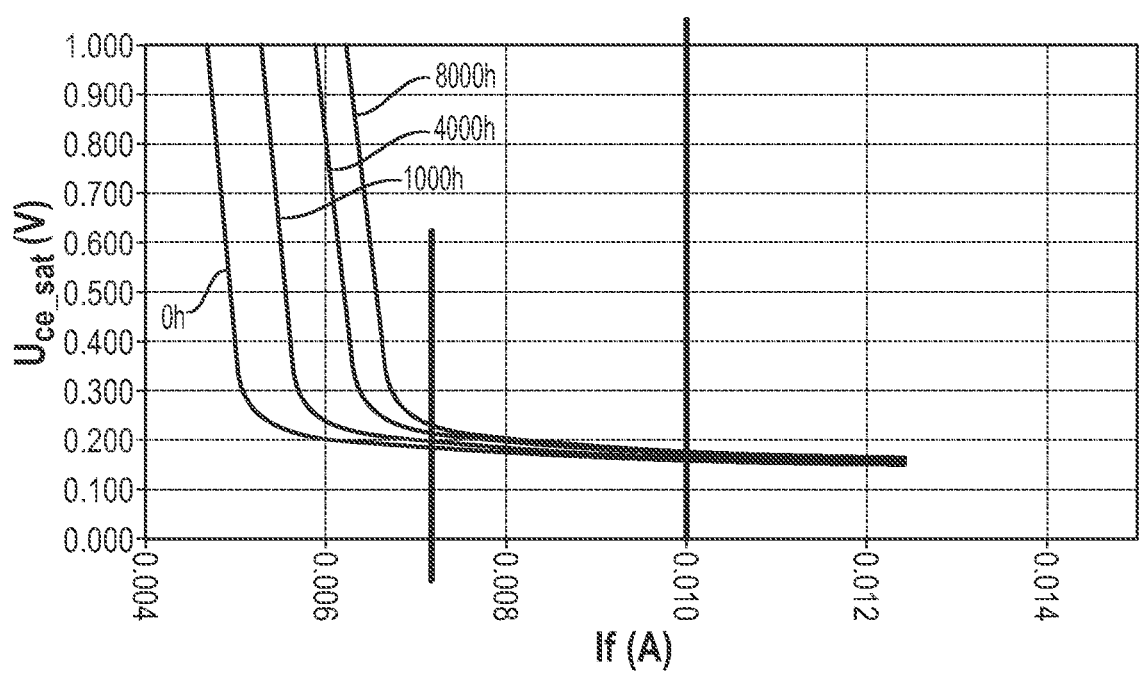
Figure 8:
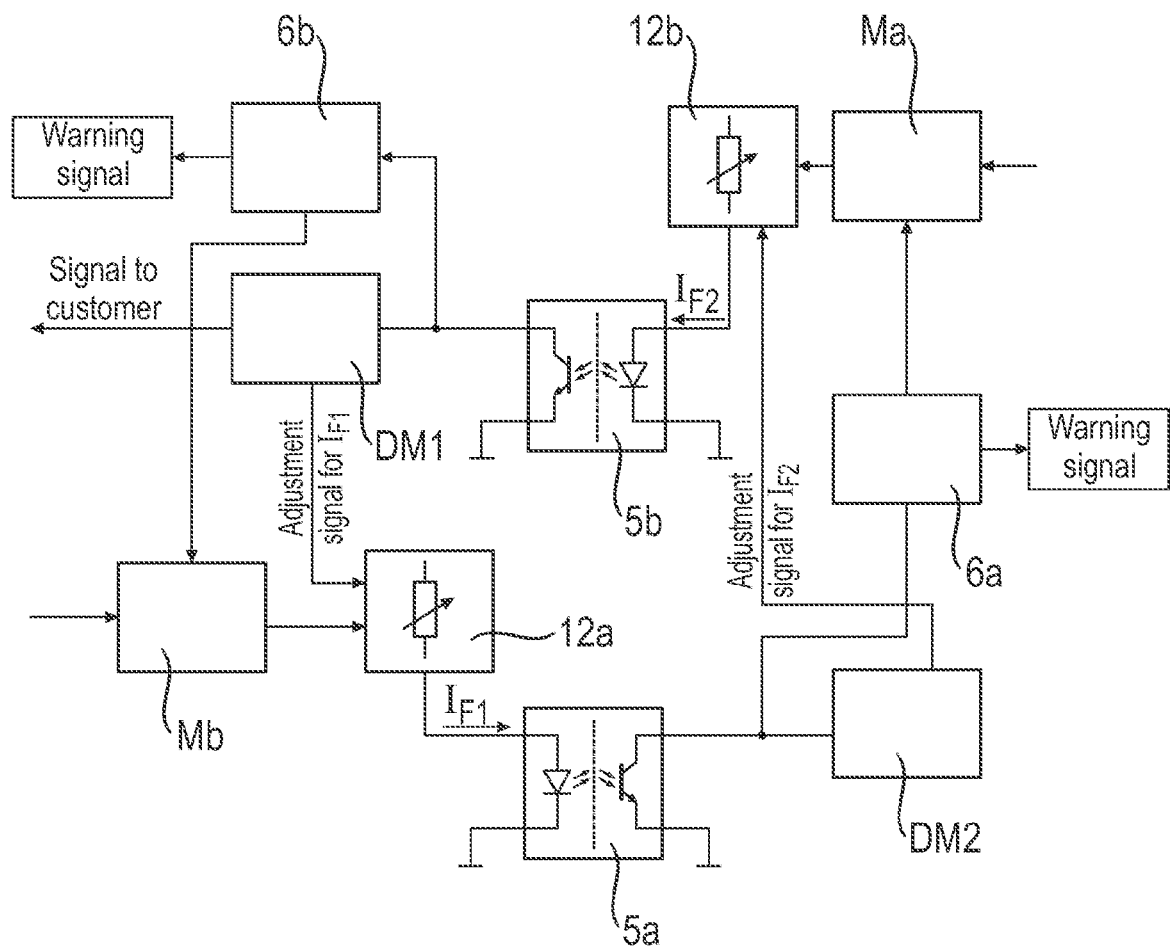

FIG. 3 is a block diagram for measuring the saturation voltage of an optocoupler, FIG. 4a shows the behaviour of the saturation voltage as a function of the input current and the operating time during a long-term test to determine the degradation of an optocoupler, FIG. 4b shows the behaviour of the saturation voltage as a function of the operating time for a particular input current during a long-term test to determine the degradation of an optocoupler, FIG. 5 is a block diagram of a first embodiment of a design according to the invention of an evaluation unit of the saturation voltage, FIG. 6 is a block diagram of a second embodiment of a design according to the invention of an evaluation unit of the saturation voltage, FIG. 7 shows the behaviour of the saturation voltage as a function of the input current and the operating time during a long-term test to determine the degradation of an optocoupler, and FIG. 8 is a circuit diagram for the closed-loop control of the degradation of an optocoupler of an EC motor according to the invention.

Corresponding reference numerals indicate corresponding parts throughout the several views of the drawings.

DETAILED DESCRIPTION

Example embodiments will now be described more fully with reference to the accompanying drawings.

With regard to the following description it is claimed that the invention is not restricted to the embodiments and thereby not to all or some of the features of described combinations of features, but rather each individual sub-feature of the/each embodiment is significant for the subject matter of the invention per se detached from all other sub-features described in conjunction therewith and also in combination with any of the features of another embodiment.

Figure 1:
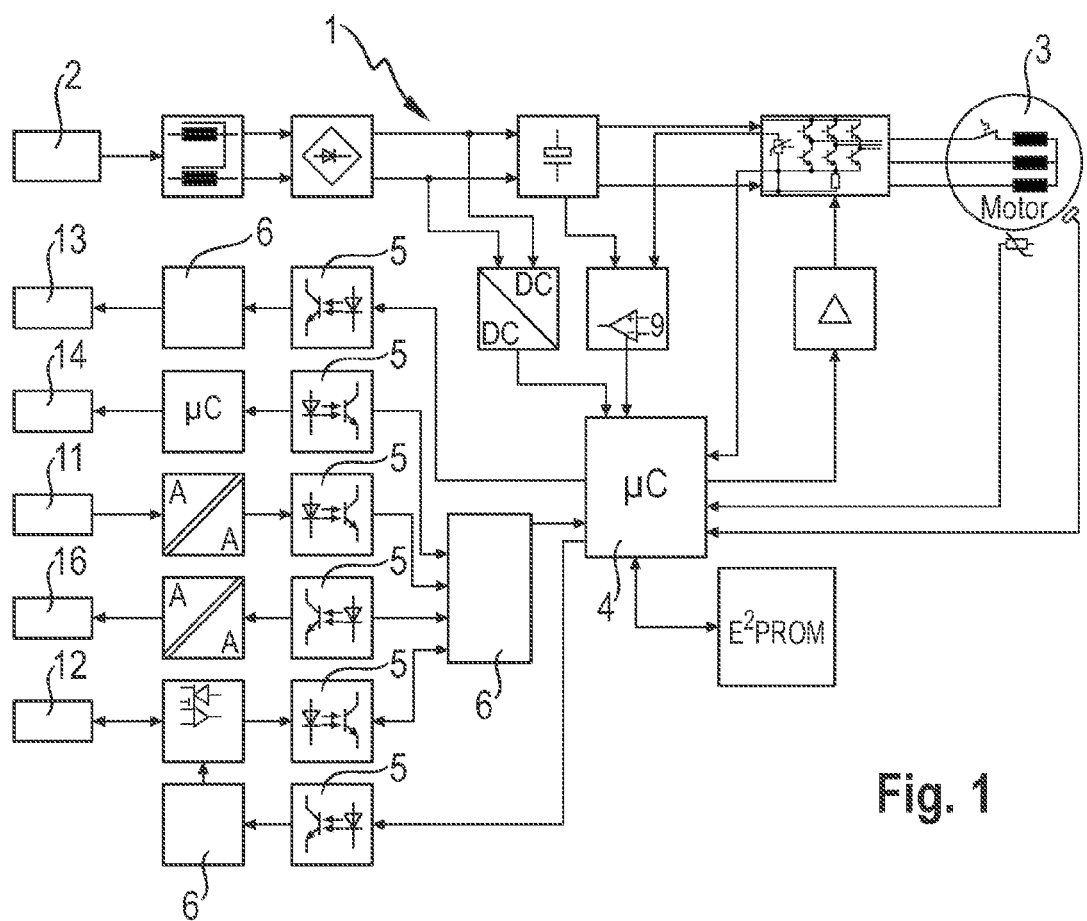
FIG. 1 is a block diagram of an EC motor according to the invention.

In FIG. 1, a block diagram of an EC motor 1 according to the invention is shown by way of example. The EC motor 1 comprises a voltage supply 2, a motor drive 3 and a motor electronics having a plurality of signal inputs, more particularly an analogue pulse-width modulation input 11 and an input line of a bidirectional interface 12, and a plurality of signal outputs, more particularly a tach output 13, an input of a bus processor 14 for connecting to a data bus, an output line of the bidirectional interface 12 and an analogue pulse-width modulation output 16. Furthermore, the motor electronics also has, for example, a microprocessor 4 for signal processing and open-loop control of the EC motor 1. In order to galvanically isolate the motor electronics, in particular the microprocessor 4, from the signal inputs and signal outputs, an optocoupler 5 is wired in each case between said inputs and outputs and the motor electronics, more particularly the microprocessor 4. In the process, the output of the optocoupler 5 is connected to an evaluation unit 6. The evaluation unit 6 measures the output of the optocoupler 5 and generates a warning signal which shows the degradation status of the respective optocoupler 5.

Figure 2:
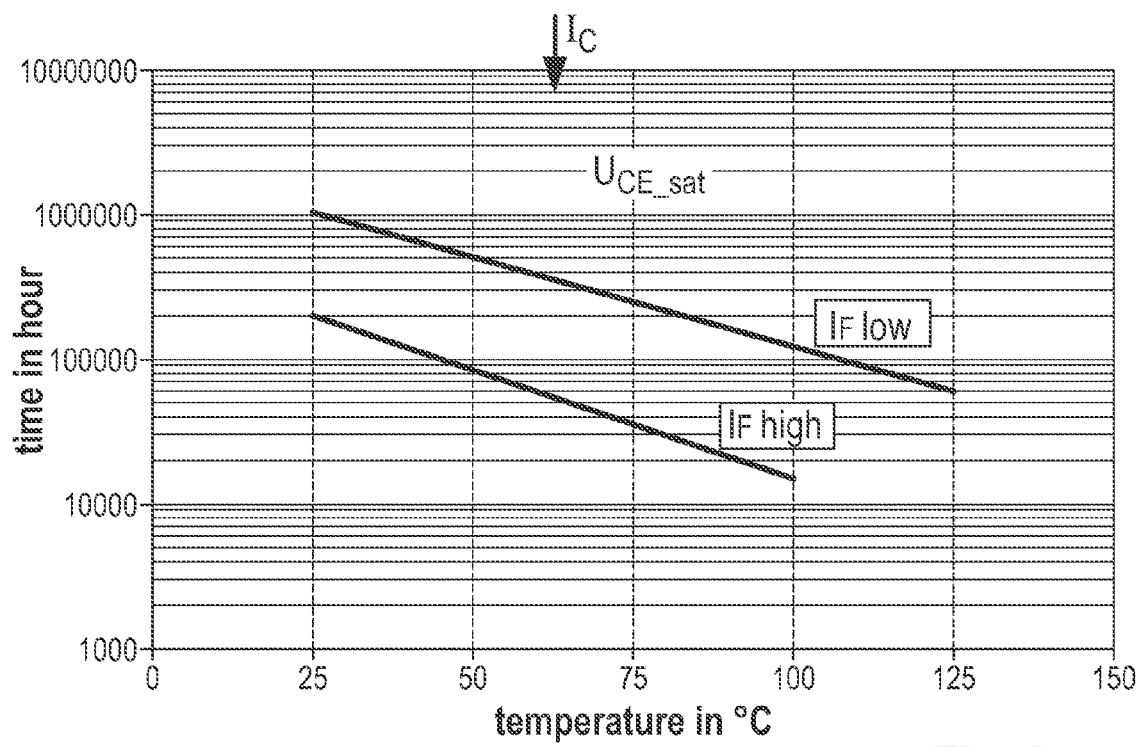
FIG. 2 is a known service life graph of an optocoupler, by way of example.

FIG. 2 shows, by way of example, a known service life graph of a manufacturer of optocouplers 5 for a particular optocoupler 5. It is known that the CTR decreases with a degraded optocoupler 5, i.e. that the output current decreases for the same input current. It can be seen from FIG. 2 that the service life of the optocoupler 5 is longer when smaller input currents $I_F$ are used and in lower ambient temperatures.

The invention is based on the knowledge that, in order for a true service life of an optocoupler 5 in the EC motor 1 to be determined, it is decisive that the signal levels used can still be reliably detected by the motor electronics at the output of the optocoupler 5 and can be differentiated from one another. Surprisingly, it has been found that the saturation voltage $U_{CE}$ increases with an increase in the degradation of the optocoupler 5. After a certain point in time, the saturation voltage $U_{CE\_Sat}$ is so high that it is no longer possible for the motor electronics to reliably differentiate between a wired and non-wired state of the optocoupler 5, whereby undesirable malfunctions of the motor electronics may occur. Depending on the application, i.e. more particularly depending on the motor electronics, there exists a maximum permissible saturation voltage $U_{REF}$ as a reference threshold, at which circuit parts connected downstream of the optocoupler 5 only just work as specified. In typical motor electronics, it has been shown that the value for $U_{REF}$ is between 0.3 V and 1 V depending on the sensitivity of the motor electronics. If the reference threshold $U_{REF}$ is exceeded, a warning message can for example be output by the evaluation unit 6.

To confirm the dependency of the saturation voltage $U_{CE\_Sat}$ on the degradation of an optocoupler 5, a long-term test according to FIG. 3 was carried out with an optocoupler 31. According to the specification sheet, the optocoupler 5 used for this test, more particularly a Vishay TCLT1105, guarantees a CTR of at least 50% until the end of the service life. The saturation voltage $U_{CE\_Sat}$ of the optocoupler 31 can be measured in a simple manner at the output of the optocoupler 5 in accordance with the circuit in FIG. 3. To accelerate the aging effect of the optocoupler 5, the optocoupler 5 was statically energised with an input current of $I_F$=60 mA at an ambient temperature of $T_A$=60° C. The saturation voltage $U_{CE\_Sat}$ was measured as a function of the input current $I_F$ at the output of the optocoupler 5 at regular intervals (at 0, 400, 1000, 2000, 4000, 6000 and 8000 hours of operation), the input current $I_F$ being increased continuously during measurement from 0 to 15 mA. To measure the saturation voltage $U_{CE\_Sat}$, the operating point of the optocoupler 5 on the output side was set at an output current $I_C$ of 5 mA.

FIGS. 4a and 4b show the measurement results of the long-term test. FIG. 4a shows the output behaviour of the optocoupler 5 in relation to the saturation voltage $U_{CE\_Sat}$ over an operating time of up to 8000 hours (h) as a function of the input current $I_F$. The measurement was carried out by means of a curve tracer (KEITHLEY 2410). FIG. 4b shows the curve of the saturation voltage $U_{CE\_Sat}$ over the operating time at the set operating point at an input current $I_F$=10 mA and an output current $I_C$=5 mA. In the selected optocoupler 5, this corresponds to the value at which the component manufacturer specifies the minimum transmission factor CTR in the specification sheet for the saturation voltage $U_{CE\_Sat}$. At a CTR of at least 50%, the optocoupler 5 still has to safely drive 5 mA, and the saturation voltage $U_{CE\_Sat}$ should be in the lower voltage region in the case of a functional optocoupler 5.

The measurements show significant degradation across the operating period. At the initial state (0 h), the saturation voltage $U_{CE\_Sat}$ was approximately 187 mV. From around 6000 h onwards, the bend region of the characteristic curve is exceeded, so the saturation voltage $U_{CE\_Sat}$ increases sharply. At 8000 h, the saturation voltage $U_{CE\_Sat}$ increases up to 512 mV.

Therefore, in an EC motor 1, the true degradation of the optocoupler 5 in relation to the motor electronics used in the EC motor 1 can be determined by a relatively simple measurement of the saturation voltage $U_{CE\_Sat}$ at the output of the optocoupler 5 by means of an evaluation unit 6. Determining the degradation in this way by measuring the saturation voltage $U_{CE\_Sat}$ has the additional advantage that it functions independently of the input current and the ambient temperature and can in practice be applied at any operating point. The measurement is carried out while the LED of the optocoupler 5 is switched on, i.e. during a low signal level at the output of the optocoupler. The reference threshold $U_{REF}$ indicates up to which maximum saturation voltage $U_{CE\_Sat}$ the motor electronics can still differentiate a low signal level from a high signal level at the output of the optocoupler 5 so as to ensure the functionality of the motor electronics. When the reference threshold $U_{REF}$ is exceeded, the evaluation unit 6 generates, for example, a warning message for the user before the motor electronics stops working. Therefore, the user has sufficient time to provide a replacement optocoupler 5 without shutting down the device for a relatively long time.

FIG. 5 shows a specific embodiment of the evaluation unit 6. The evaluation unit 6 comprises two series-connected resistors R1, R2 and a comparator 7. The evaluation unit is connected to the voltage source of the motor electronics via the resistor R1. The comparator 7 has two voltage inputs, a first voltage input being wired between the two resistors R1 and R2. The resistors R1 and R2 form a voltage distributor and are designed in terms of their electrical resistance such that, at the first voltage input of the comparator 7, they form a reference voltage corresponding to the reference threshold $U_{REF}$. The second voltage input of the comparator 7 is connected to the output of the optocoupler 5 so that the saturation voltage $U_{CE\_Sat}$ is applied at the second voltage input of the comparator when the optocoupler is wired. The evaluation unit 6 therefore measures the saturation voltage $U_{CE\_Sat}$ and compares it with the reference voltage by means of the comparator 7. If the saturation voltage $U_{CE\_Sat}$ exceeds the reference voltage, the comparator 7 of the evaluation unit 6 outputs a warning signal which advises about a necessary replacement of the optocoupler 5.

An alternative embodiment of the evaluation unit 6 is shown in FIG. 6. The evaluation unit 6 comprises an amplifier 8 and a microprocessor 9. An input of the amplifier 8 is connected to the output of the optocoupler 5, so that the saturation voltage $U_{CE\_Sat}$ is applied at the input of the amplifier 8 when the optocoupler 5 is wired. The microprocessor 9 is connected to the output of the amplifier 8 and evaluates the amplified saturation voltage $U_{CE\_Sat}$ by comparing the amplified saturation voltage $U_{CE\_Sat}$ with a reference threshold $U_{REF}$ adapted to the amplification and generating a warning signal at one output when then reference threshold $U_{REF}$ is exceeded.

The evaluation unit 6 can also be integrated in part into the motor electronics and can for example utilise the microprocessor 4 of the motor electronics instead of a separate microprocessor 9.

Another embodiment of the invention is based on the knowledge from the measurement results of the long-term tests that the entire sent current $I_F$ is not always necessary at the LED for the required output current $I_C$. The input current $I_F$ required in theory to achieve saturation results from the set output current $I_C$ at the output of the optocoupler 5 and from the CTR of the optocoupler 5 ($I_F$=$I_C$*100/CTR). In particular in a new optocoupler 5, which is still a long way from the end of its service life, a relatively low input current $I_F$ is sufficient in reality to achieve a sufficiently low saturation voltage $U_{CE\_Sat}$<$U_{REF}$ for the motor electronics. The input current $I_F$ can be reduced by feedback to the input of the optocoupler 5 to a point where the detected saturation voltage $U_{CE\_Sat}$ is only just below the reference threshold $U_{REF}$.

If for example a reference threshold of $U_{REF}$=0.3 V is determined for the motor electronics, then it can be seen for the optocoupler 5 in FIG. 7, in which the aging effect is not as significant after 8000 h as it is in FIG. 4, that, up to an operating time of 8000 h, an input current $I_F$ of approximately just 7 mA is sufficient to achieve a sufficiently low saturation voltage of <0.3 V for an output current of $I_C$=5 mA when the optocoupler has a CTR of 50%. The input current $I_F$ calculated by means of the CTR would be 10 mA. Since the degradation of the optocoupler 5 depends particularly heavily on the level of the input current $I_F$ (see also FIG. 2), the service life in relation to operating the optocoupler 5 at a higher input current $I_F$ is extended by reducing the input current $I_F$. In addition, this embodiment of the invention saves energy during operation of the optocoupler.

FIG. 8 shows an exemplary block diagram of an embodiment of an EC motor 1 with feedback, according to the invention, of the optocoupler 5. In this embodiment of the EC motor, bidirectional signal transmission is possible, i.e. signals are transmitted from the signal inputs to the motor control unit via a first optocoupler 5a and from the motor control unit to the signal outputs of the EC motor via a second optocoupler 5b. At the output of the optocoupler 5a, a first evaluation unit 6a detects the current saturation voltage $U_{CE\_Sat\_5a}$ and compares this with a reference threshold $U_{REF}$. If the saturation voltage $U_{CE\_Sat\_5a}$ is higher than the reference threshold $U_{REF}$, the end of the service life of the first optocoupler 5a has been reached, and a warning signal is generated, as already described above. If the saturation voltage $U_{CE\_Sat\_5a}$ is below the reference threshold $U_{REF}$, the adjustment signal $S_{F1}$ is calculated as a function of the saturation voltage $U_{CE\_Sat\_5a}$ by a microprocessor, which is used for the closed-loop current regulator of the input current $I_{F1}$ of the first optocoupler 5a by means of a current regulator 12a connected to the input of the optocoupler 5a. The input current $I_{F1}$ is reduced to a point at which the detected saturation voltage $U_{CE\_Sat\_5a}$ is still below the reference threshold $U_{REF}$. As the degradation continues, the saturation voltage $U_{CE\_Sat}$ increases for a particular input current $I_{F1}$, so that the input current $I_{F1}$ is increased as the service life progresses, but only ever to the extent that the saturation voltage $U_{CE\_Sat\_5a}$ remains below the reference threshold $U_{REF}$. After a certain operating period, an increase in the input current $I_{F1}$ will no longer maintain the saturation voltage $U_{CE\_Sat}$ below the reference threshold $U_{REF}$, so that in this case the warning signal is generated by the first evaluation unit 6a, as described above. In this context, the reference threshold $U_{REF}$ is adapted to the particular application such that said threshold is still sufficiently below the real end of the service life in each case.

To transmit the adjustment signal $S_{F1}$ back to the galvanically isolated input of the optocoupler 5a, the reverse channel is used for transmitting a useful signal as an output signal from the motor control unit to the signal outputs of the EC motor 1 via the second optocoupler 5b. Nevertheless, only digital signals can be transmitted using the optocouplers 5a and 5b. Therefore, the analogue adjustment signal $S_{F1}$ for the closed-loop control of the first optocoupler 5a is modulated onto the useful signal of the motor control unit at the input of the second optocoupler 5b by means of a modulator 13a, demodulated at the output of the second optocoupler 5b by means of a demodulator 14a, and fed to the current regulator 12a. Reducing the sent current $I_{F1}$ favours the service life of the first optocoupler 5a and reduces the required energy in the circuit.

This principle can also be transferred to the second optocoupler 5b. Accordingly, a second evaluation unit 6b at the output of the second optocoupler 5b detects the current saturation voltage $U_{CE\_Sat\_5b}$ and compares this with a reference threshold $U_{REF}$. If the saturation voltage $U_{CE\_Sat\_5b}$ is above the reference threshold $U_{REF}$, the end of the service life of the second optocoupler 5b has been reached, and a warning signal is generated, as already described above. If the saturation voltage $U_{CE\_Sat\_5b}$ is below the reference threshold $U_{REF}$, an adjustment signal $S_{F2}$ is calculated as a function of the saturation voltage $U_{CE\_Sat\_5b}$ by a microprocessor, which is used for closed-loop control of the input current $I_{F2}$ by means of a second current regulator 12b connected to the input of the second optocoupler 5b. The input current $I_{F2}$ is controlled accordingly in a closed-loop manner. For this purpose, a second analogue adjustment signal $S_{F2}$ for the closed-loop control of the second optocoupler 5b is modulated onto the useful signal at the output of the first optocoupler 5a by a second modulator 13b, demodulated at the output of the first optocoupler 5a by a second demodulator 14b, and fed to a second current regulator 12b.

The invention is not limited to the embodiments shown and described but also covers all embodiments acting in the same way in terms of the invention. It is expressly emphasised that the embodiments are not limited to all of the features in combination but rather each individual sub-feature can also have an inventive significance per se even when detached from all of the other sub-features. Furthermore, so far the invention has not been limited to the combinations of features defined in the claims but rather can also be defined by any other combination of certain features or all disclosed individual features. This means that, in principle, practically every individual feature of the claims can be omitted or replaced by at least one individual feature disclosed elsewhere in the application.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An EC motor comprising:
a motor electronics,
a signal input or a signal output, and
a first optocoupler for the galvanically isolated transmission of a useful signal between a motor control unit and the signal input or the signal output, wherein
when the first optocoupler is wired, a first evaluation unit regularly evaluates a saturation voltage of the first optocoupler at an output of said first optocoupler in relation to a reference threshold and generates a warning signal when the saturation voltage exceeds the reference threshold.

2. The EC motor according to claim 1, wherein the first evaluation unit comprises two resistors and a comparator, the resistors being designed as voltage distributors such that they generate a reference voltage, corresponding to the reference threshold, at a first input of the comparator, and the output of the first optocoupler is connected to a second input of the comparator, so that the saturation voltage is applied at the second input of the comparator when the first optocoupler is wired, and the comparator generates the warning signal at an output of the first evaluation unit when the saturation voltage exceeds the reference threshold.

3. The EC motor according to claim 1, wherein the first evaluation unit comprises an amplifier and a microprocessor, an input of the amplifier being connected to the output of the first optocoupler, so that the saturation voltage is applied at the input of the amplifier when the first optocoupler is wired, and an output of the amplifier is connected to an input of the microprocessor, the microprocessor evaluating the amplified saturation voltage and comparing this with the reference threshold, and the microprocessor generating the warning signal at an output of the first evaluation unit when the amplified saturation voltage exceeds the reference threshold.

4. The EC motor according to claim 1, wherein the first evaluation unit generates an adjustment signal for a closed-loop control of an input current of the first optocoupler on the basis of a ratio of the value of the saturation voltage to the reference threshold, the adjustment signal being directly or indirectly connected to an input of a current regulator for the closed-loop control of the input current.

5. The EC motor according to claim 4, wherein the EC motor comprises at least one second optocoupler for transmitting a second useful signal and a first modulator and a first demodulator, the first modulator modulating, upstream of the input of the second optocoupler, the adjustment signal for the current regulator of the first optocoupler onto the useful signal to be transmitted via the second optocoupler, and the first demodulator demodulating, downstream of the output of the second optocoupler, the adjustment signal for the current regulator of the first optocoupler from the useful signal.

6. The EC motor according to claim 5, wherein the EC motor comprises at least one second evaluation unit, the second evaluation unit generating a second adjustment signal for the closed-loop control of an input current of the second optocoupler according to the ratio of the value of the saturation voltage of the second optocoupler to the reference threshold, the second adjustment signal being either directly or indirectly connected to an input of a second current regulator for the closed-loop control of the input current of the second optocoupler.

7. The EC motor according to claim 6, wherein the EC motor comprises a second modulator and a second demodulator, the second modulator modulating, upstream of the input of the first optocoupler, the adjustment signal for the current regulator of the second optocoupler onto the useful signal to be transmitted via the first optocoupler, and the second demodulator demodulating, downstream of the output of the first optocoupler, the adjustment signal for the current regulator of the second optocoupler from the useful signal.

* * * * *